(12) United States Patent
Franklin

(10) Patent No.: US 9,081,678 B2
(45) Date of Patent: Jul. 14, 2015

(54) VOLTAGE CONTROL

(71) Applicant: ASTRIUM LIMITED, Stevenage (GB)

(72) Inventor: John David Frank Franklin, Stevenage (GB)

(73) Assignee: ASTRIUM LIMITED, Stevenage, Hertfordshire (GB)

( * ) Notice: Subject to any disclaimer, the term of this patent is extended or adjusted under 35 U.S.C. 154(b) by 186 days.

(21) Appl. No.: 13/682,385

(22) Filed: Nov. 20, 2012

(65) Prior Publication Data

US 2013/0138993 A1    May 30, 2013

(30) Foreign Application Priority Data

Nov. 24, 2011    (EP) .................................... 11275146

(51) Int. Cl.
| | |
|---|---|
| G06F 11/07 | (2006.01) |
| G06F 1/32 | (2006.01) |
| G06F 11/10 | (2006.01) |
| G06F 11/14 | (2006.01) |
| G06F 11/16 | (2006.01) |
| G11C 5/14 | (2006.01) |

(52) U.S. Cl.
CPC .......... *G06F 11/0793* (2013.01); *G06F 1/3296* (2013.01); *G06F 11/0739* (2013.01); *G06F 11/1048* (2013.01); *G06F 11/1405* (2013.01); *G06F 11/167* (2013.01); *G06F 11/1641* (2013.01); *G11C 5/147* (2013.01); *Y02B 60/1285* (2013.01)

(58) Field of Classification Search
CPC ....... G06F 11/0724; G06F 1/30; G06F 1/305; G06F 11/0796

USPC ....................................................... 714/11, 14
See application file for complete search history.

(56) References Cited

U.S. PATENT DOCUMENTS

| | | | |
|---|---|---|---|
| 8,839,071 B2* | 9/2014 | Jo .................................. | 714/763 |
| 2004/0067740 A1* | 4/2004 | Handa et al. ............... | 455/127.1 |
| 2005/0083798 A1* | 4/2005 | Fujiune et al. ............. | 369/44.26 |
| 2005/0154573 A1* | 7/2005 | Maly et al. ...................... | 703/21 |
| 2005/0223251 A1* | 10/2005 | Liepe et al. .................... | 713/322 |
| 2005/0240793 A1* | 10/2005 | Safford et al. ..................... | 714/1 |
| 2007/0174746 A1* | 7/2007 | Haefliger et al. ............. | 714/721 |
| 2009/0089604 A1* | 4/2009 | Malik et al. .................... | 713/340 |
| 2009/0164871 A1* | 6/2009 | Jo .................................. | 714/764 |
| 2009/0319117 A1* | 12/2009 | Nakane .......................... | 701/29 |
| 2012/0284586 A1* | 11/2012 | Wang ............................ | 714/763 |
| 2013/0321072 A1* | 12/2013 | Yao et al. ...................... | 327/540 |
| 2014/0191734 A1* | 7/2014 | Kuang et al. .................. | 323/234 |

FOREIGN PATENT DOCUMENTS

JP    2010014562 A    *    1/2010

* cited by examiner

*Primary Examiner* — Chae Ko
(74) *Attorney, Agent, or Firm* — Buchanan Ingersoll & Rooney PC

(57) ABSTRACT

An apparatus for controlling a supply voltage to an electronic processing arrangement comprising a processor or a memory element, the apparatus being configured to receive an output of the electronic processing arrangement and comprising: error detection means for detecting errors in an output of the electronic processing arrangement; and means for adaptively varying the supply voltage to the electronic processing arrangement based on an analysis of errors detected in the output of the electronic processing arrangement. The apparatus may further comprise means for correcting errors detected in the output of the electronic processing arrangement.

15 Claims, 4 Drawing Sheets

VOLTAGE CONTROL

FIELD OF THE INVENTION

The invention relates to the control of voltage supplied to an electronic processing arrangement.

BACKGROUND OF THE INVENTION

The manufacturer's recommended operating voltage for electronic processing arrangements is often chosen to minimise errors. Typically, the lower the supply voltage, the higher the rate of errors in the output of the electronic processing arrangement. Recommended operating voltages are usually notably higher than the voltage at which errors would begin to occur. This is because manufacturers include a voltage margin in an effort to account for a number of possible variable factors, for example supply voltage error, silicon process parameters, temperature effects, radiation and transistor age effects.

Various voltage selection methods which aim to reduce the operating voltage without losing system accuracy are known. By operating a system at lower voltages, the overall power consumption of the system may be reduced. For example, it is known to vary the voltage based on clock speed. It is also known to use a device to calculate an appropriate processor voltage based on the operating conditions of a processor, the calculated processor voltage including a safety margin akin to that implemented by manufacturer nominal operating voltages, and to control a supply voltage to the processor accordingly. Furthermore, it is known to operate a processor cache at a fixed voltage value low enough to incur erroneous cache outputs, and then to attempt to correct those erroneous outputs. Additionally, processors designed to allow the voltage to individual components of the processor to be controlled internally are known.

In data processing systems provided on spacecrafts it is common to use primary and redundant processing elements to carry out processing tasks in parallel. The power consumption of the overall system is then the combined power consumption of the primary processing elements and the redundant processing elements.

The invention was made in this context.

SUMMARY OF THE INVENTION

According to the invention, there is provided an apparatus for controlling a supply voltage to an electronic processing arrangement comprising a processor or a memory element, the apparatus being configured to receive an output of the electronic processing arrangement and comprising: error detection means for detecting errors in the output of the electronic processing arrangement; and means for adaptively varying the supply voltage to the electronic processing arrangement based on an analysis of errors detected in the output of the electronic processing arrangement.

The apparatus may also comprise means for correcting errors detected in the output of the electronic processing arrangement.

The invention allows the voltage to be controlled to keep the error rate on the limit of operation and therefore the processing arrangement to be operated at the most power efficient point. The invention also allows the errors that occur to be corrected to ensure that the accuracy of the output of the processing arrangement is not compromised.

The electronic processing arrangement may comprises two independent processors configured to carry out corresponding processing tasks for providing identical output values, when there are no errors, and wherein the error detection means is configured to detect errors in the output of the electronic processing arrangement by comparing an output value of one of the two processors with an output value of the other of the two processors. The means for correcting errors may be configured to instruct at least one of the two independent processors to repeat a processing task to correct an error in an output of the electronic processing arrangement.

Comparing the output value of one of the processors with the output value of the other processor may involve comparing the two output values directly or comparing checksums or other values calculated from the output values.

The electronic processing arrangement may comprise one or more memory elements configured to store system data and error management data associated with the system data, the output of the electronic processing arrangement comprising said system data and error management data, and wherein the error detection means is configured to detect errors in the system data by analysing the system data and the error management data associated with said system data. The error detection means may compare values calculated from the system data with the error management data. In addition, the means for correcting errors in the output of the electronic processing arrangement may be configured to correct the output based on the error management data. The one or more memory elements may comprise two memory elements configured to store identical data, in normal operation when there are no errors. The error correction means may be configured to correct an error detected in the output from one memory element by retrieving the corresponding correct value from the other memory element. The two memory elements may belong to separate processors. Alternatively, the two memory elements may belong to the same processor.

The one or more memory elements may comprise random access memory (RAM). The error management data may comprise RAM parity information. In other words, the RAM may be parity RAM.

The electronic processing arrangement may comprise one or more processors and/or one or more memory elements. The means for adaptively controlling the voltage may be configured to control the voltage to an appropriate level where the likelihood of a single event latch-up occurring in the one or more processors and/or the one or more memory elements is reduced.

The apparatus may comprise a controller or control arrangement, such as an FPGA, providing said error detection means, the means for adaptively varying the supply voltage and the means for correcting errors. The means for adaptively varying the voltage may be configured to instruct a power supply for supplying a voltage to the electronic processing arrangement to vary the voltage to the electronic processing arrangement.

The electronic processing arrangement may comprise one or more processors, one or more memory elements or one or more processors and one or more memory elements and the same or separate control apparatus may be configured to control the voltage to the processors and the memory elements. The processors may be configured to carry out processing tasks, such as for example calculations, and the memory elements may be configured to store the results of the calculations and other processing tasks.

According to the invention, there is also provided a system comprising: an electronic processing arrangement; and an apparatus as set out above for controlling the voltage supplied to said electronic processing arrangement.

Furthermore, according to the invention, there is provided a method of reducing a supply voltage provided to an electronic processing arrangement comprising a processor or a memory element, comprising: receiving an output of the electronic processing arrangement; determining if the output of the electronic processing arrangement comprises an error; determining if an adjustment to the voltage supplied to the electronic processing arrangement is required based on an analysis of errors in the output; and, if an adjustment is required, adjusting the voltage.

The method may further comprise correcting an error detected in the output of the electronic processing arrangement.

The electronic processing arrangement may comprise two processors configured to carry out corresponding processing tasks to provide identical outputs, in normal operation when there are no errors, wherein determining if the output of the electronic processing arrangement comprises an error comprises comparing the output of one of the processors with the output of the other processor; and wherein correcting the error comprises instructing at least one of the two processors to repeat the processing task. Comparing the output of one of the processors with the output of the other processor may involve comparing the two outputs directly or comparing checksums or other values calculated from the outputs.

The electronic processing arrangement may comprise two random access memory (RAM) elements for storing the same data, each memory element being configured to store system data and associated error management data and the output of the electronic processing arrangement comprising system data and associated error management data, wherein determining if the output comprises an error comprises analysing error management data in the output of the memory elements and wherein correcting the error comprises correcting an error in the output of the one memory element based on the error management data or based on data read out from the other memory element.

Controlling the voltage may comprise controlling the voltage to avoid single event latch-up occurring in an element of the electronic processing arrangement. In more detail, controlling the voltage may comprise controlling the voltage to avoid single event latch-up occurring in one or more processors and/or one or more memory elements of the electronic processing arrangement.

According to the invention, there is also provided a computer program comprising instructions that when executed by a processor cause the processor to perform the above method.

BRIEF DESCRIPTION OF THE DRAWINGS

Embodiments of the invention will now be described, by way of example, with reference to FIGS. 1 to 5 of the accompanying drawings, in which.

DETAILED DESCRIPTION

Figure 1:
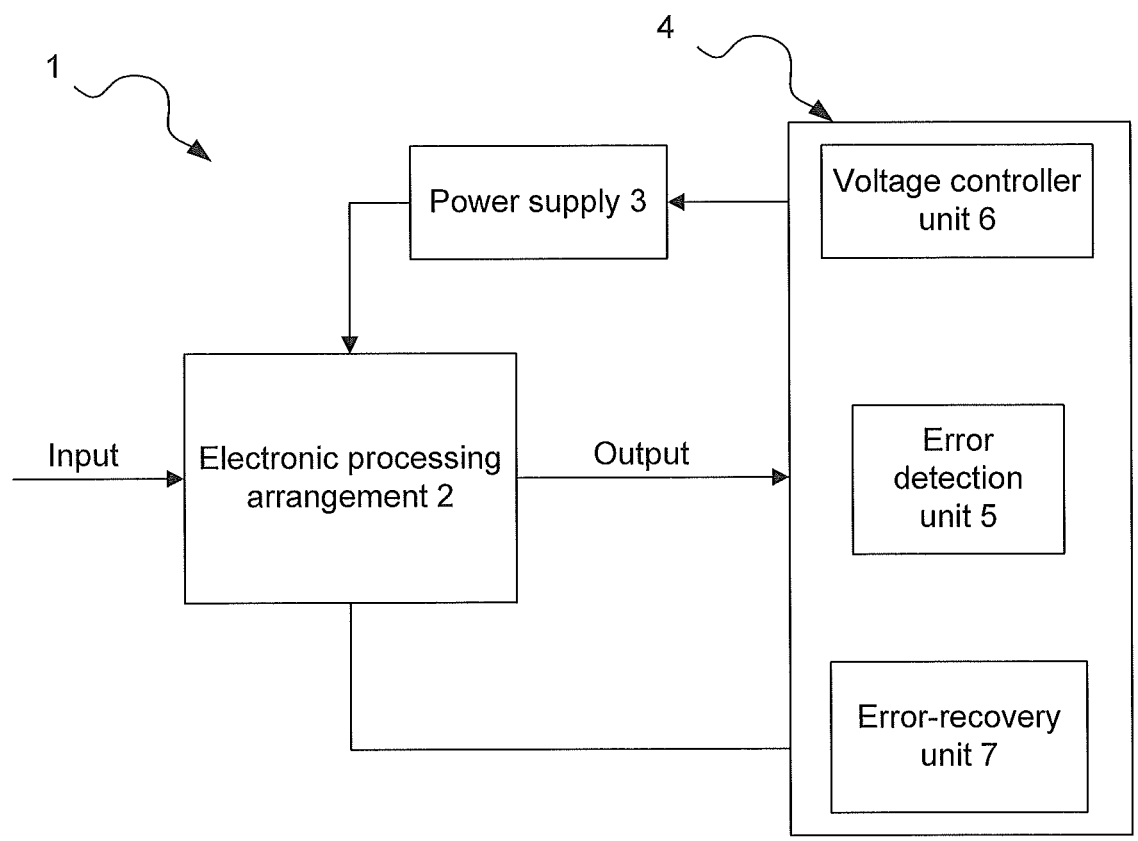
FIG. 1 is a schematic block diagram of a system comprising an electronic processing arrangement, a power supply, and a control apparatus.

With reference to FIG. 1, a system 1 is shown comprising an electronic processing arrangement 2, a power supply 3, and a control apparatus 4. The electronic processing arrangement 2 is powered by the power supply 3, and the control apparatus 4 controls the power supply to adjust the voltage supplied to the electronic processing arrangement. The electronic processing arrangement may comprise one or more electronic processing units, as will be described in more detail below. The control apparatus comprises an error detection unit 5, voltage controller unit 6, and an error-recovery unit 7.

The error detection unit 5 checks the outputs of the electronic processing arrangement 2 for errors. After performing this check, the error detection unit communicates to the error-recovery unit 7 and the voltage controller unit 6 whether or not the information output by the electronic processing arrangement is detected as being erroneous. The voltage controller unit 6 analyses error information from the error detection unit 5 to decide whether and how to instruct the power supply 3 to vary the supply voltage to the electronic processing arrangement 2. The lower the supply voltage, the higher the error rate will be in the electronic processing arrangement outputs. The voltage controller unit 6 may decide to reduce the supply voltage to a level at which an acceptable number of errors occur. The supply voltage may be maintained at the minimum value capable of sustaining predominantly correct operation while at the same time allowing occasional errors to occur. If too many errors are being detected, the voltage controller unit 6 will increase the voltage. Conversely, if a rate of errors below an error rate threshold is being detected, the voltage controller unit may lower the voltage supplied to the electronic processing arrangement 2 further. The voltage controller unit 6 may increase and decrease the voltage by a predetermined fixed amount each time or by a variable amount determined by the analysis of the output error behaviour.

As one example, the analysis of the errors may just involve the voltage controller determining to increase the voltage by a fixed amount each time an error occurs and determining to decrease the voltage by a fixed amount if, after a predetermined time period, no errors have occurred. The voltage step-size may be the same in each adjustment. The voltage controller may store a record of each error to be able to determine whether there has been any errors during a given time period. Alternatively, a timer may be started after each error and restarted when there is a new error. When a predetermined time period has elapsed since the time the timer was started, indicating that there have been no errors in that time, the controller may reduce the voltage. The predetermined time period may be any suitable time period, including but not limited to a few minutes or a few hours.

The analysis may alternatively involve a more comprehensive analysis of the error behaviour and the frequency at which errors are detected. For example, the voltage controller may calculate the average error rate over a period of time. In that case, the voltage step-size may be fixed or determined based on the average error rate.

The step-size of the voltage adjustment for any adjustment method may depend on the details of the electronic processing arrangement. The size of each voltage adjustment would need to be sufficiently small to allow stable operation. As an example, the error rate in the output from the electronic processing arrangement may converge to an error rate of approximately an average of one error during every 5 minutes of operation. An error rate of the order of one error every few minutes may be used as a threshold error rate depending on which a decision is based to increase or decrease the voltage. However, this is of course just one example of a threshold error rate and any suitable threshold error rate can be used.

It is contemplated that in at least some environments, an electronic processing arrangement can be operated such that the output of an electronic processing arrangement will always contain some errors. The voltage supplied may be selected so as not to increase the error rate beyond the level which would normally be expected from the electronic processing arrangement or so as to keep the error rate at a level at which the control apparatus 4 is able to correct the errors. It will be appreciated that the minimum voltage that can be supplied will vary over time and with the environment, for example the temperature and background radiation. Consequently, the control apparatus 4 is configured to continuously analyse the error rate and adaptively adjusts the voltage as required.

When informed of an error in the electronic processing arrangement 2 output, the error-recovery unit 7 recovers, or attempts to recover, the correct output by communicating with the electronic processing arrangement. In this way, the control apparatus 4 allows very low-power operation of the one or more electronic processing units by operating them at, or very close to, the limit of failure without incurring any loss in the accuracy of the final output.

The control apparatus 4 may be realised in hardware, software, or a combination of the two. It may be provided as a controller or any type of suitable control arrangement. For example, the control apparatus may be provided as an integrated circuit. More specifically, the control apparatus may be conceived within a field-programmable gate array (FPGA). It will be appreciated that the description of the control apparatus as comprising an error detection unit 5, an error recovery unit 7 and a voltage control unit 6 is only a functional description and the control apparatus is not necessarily structurally divided into separate units. It will be appreciated that the control apparatus may be formed from a single processor carrying out all the functions or as a number of modules, each carrying out a part of a function or one or more functions described herein with respect to the error detection unit 5, the voltage controller unit 6 and the error recovery unit 7.

The one or more electronic processing units of the electronic processing arrangement 2 may be processors, for example digital signal processors (DSPs), and/or electronic memory elements, for example random-access-memory elements (RAM). More specifically, the memory of the electronic processing arrangement may include, but is not limited to parity memory or error correction code memory (ECC memory). If the electronic processing arrangement 2 comprises more than one electronic processing unit, they may not share the same power supply. Moreover, the voltage supplied to each electronic processing unit may be controlled differently and/or by different voltage controller units.

It is contemplated that the error detection unit 5 can be configured to detect an erroneous output from the electronic processing arrangement 2 in a number of different ways. The error detection unit may detect errors in an output by performing a suitable error-detecting consistency check on the output. The error detection unit may carry out an analysis of the output, which may include a direct comparison between different outputs or between checksums of the outputs or which may include an analysis of error management data in the output, including a comparison of values calculated from the output with error management data.

For example, if the electronic processing arrangement 2 comprises memory elements, in addition to system data, the memory elements may store error management data, including for example error-detection codes such as parity codes, that allow errors in the system data read out from the memory to be detected. The error management data may also allow errors in the system data to be corrected. The error management data may be any suitable error detection and correction code, including by not limited to error correction parity code (ECC parity code). If the electronic processing arrangement 2 comprises more than one processor, it may detect errors by performing the same task on each processor and comparing their outputs. This may be a direct comparison of two or more outputs, or it may be a comparison of values calculated from two or more outputs, for example checksum values. The error detection unit can also identify erroneous outputs by comparing outputs or checksums of outputs from different processing units when the processing units are memory elements intended to store identical or corresponding information. It is further conceived that if an electronic processing arrangement 2 comprises only one processor, errors could be detected in its output by forcing the processing unit to perform calculations twice and then comparing the two outputs, or values derived from the two outputs. Alternatively, errors in the outputs of an electronic processing arrangement comprising only one processor could be detected by using an error detection and/or correction code implemented in the outputs. If checksums are used to examine outputs, the calculation of the checksum may be performed by the processors themselves and then sent to the error detection unit 5 for examination, or the calculation of the checksum may be performed by the error detection unit.

The control apparatus 4 screens the output of the electronic processing arrangement 2 and if an error is detected in the error detection unit 5, the error recovery unit corrects the output. If the electronic processing arrangement 2 comprises processors, the output of the processors may be written to memory and the error recovery unit corrects the data stored in memory. If the electronic processing arrangement comprises memory elements, data stored in memory may be accessed by a processor and if the output of the memory element includes an error, the error recovery unit ensures both that the stored data in the memory element is corrected, if required, and that the processor receives updated and correct data. It is contemplated that the output of the electronic processing arrangement, whether from a processor or a memory, may be communicated in parallel to a recipient unit of the output, whether a memory or a processor, and the control apparatus. In this case, when an error is detected, the recipient unit may first have received incorrect data and, if so, will then have to replace the originally received data with the updated correct data. If the recipient unit is a processor, it may have to repeat any processing tasks which were based on the incorrect data. The corrected data may be received from the processor or the memory element of the electronic processing arrangement or from the control apparatus. Alternatively, the control apparatus can check the output of the processing units of the electronic processing arrangement before it is provided to the recipient unit. More specifically, the control apparatus can check an output of a processor before it is stored in memory. Moreover, the control apparatus can check the output of a memory, resulting from an attempt to access data by a processor, before the output is provided to a processor.

The system of FIG. 1 may, for example, be used on a spacecraft, such as a satellite. However, it may also be appreciated that the control apparatus 4 could be used in any device to control the voltage supplied to an electronic processing arrangement 2. Moreover, it should be realised that although the control apparatus of FIG. 1 has been described to comprise an error-recovery unit 7, the control apparatus 4 does not have to be configured to correct any errors. For example, the system may be set up to handle infrequent errors and/or the adaptive voltage adjustments may be set up such that the voltage is conservatively reduced to make sure that errors only occur very infrequently.

Figure 2:
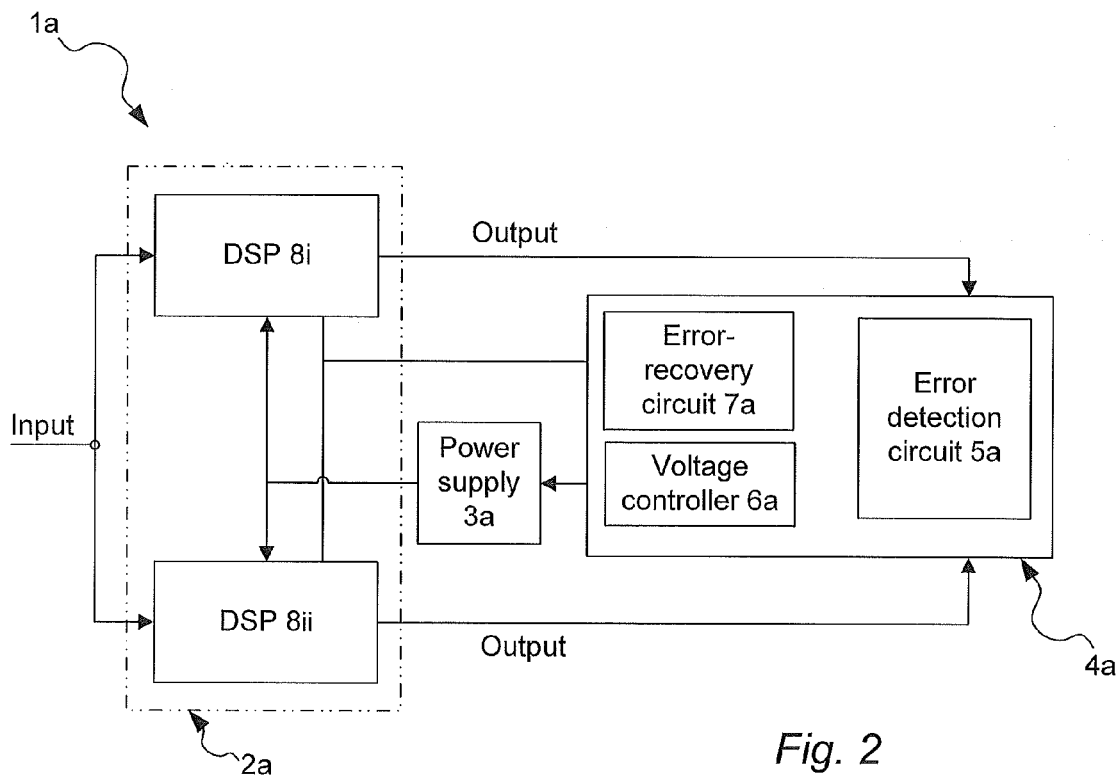
FIG. 2 is a schematic block diagram of an embodiment of the system of FIG. 1, wherein the electronic processing arrangement comprises two digital signal processors.
Figure 3:
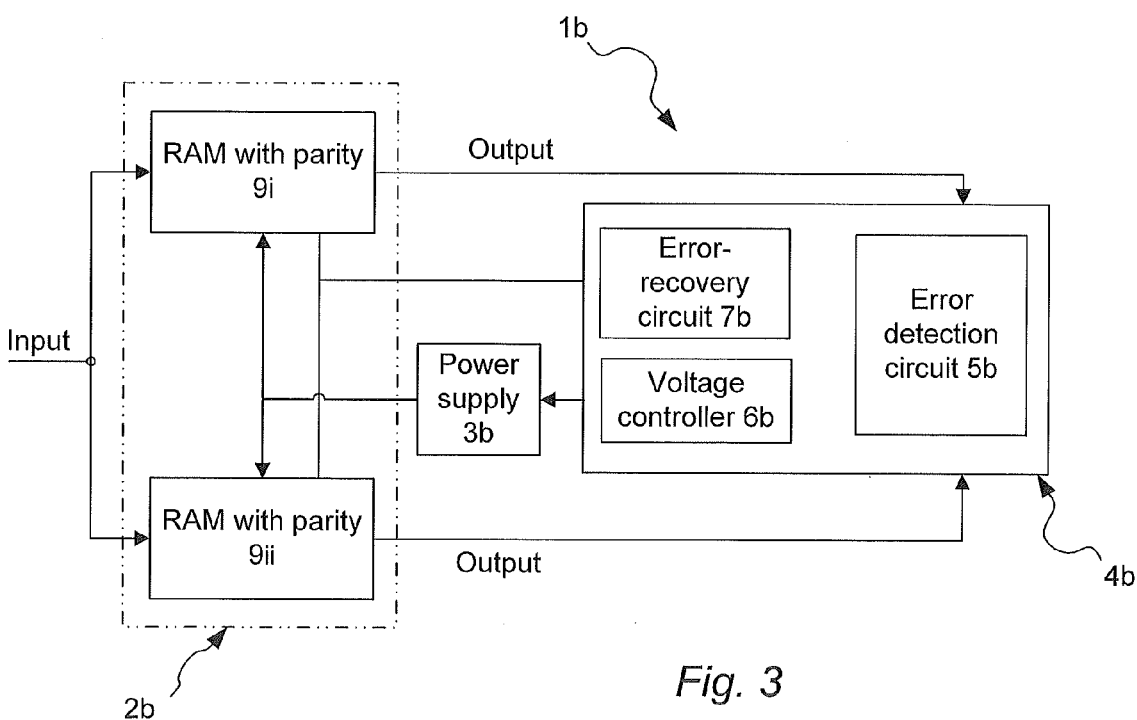
FIG. 3 is a schematic block diagram of an embodiment of the system of FIG. 1, wherein the electronic processing arrangement comprises two random-access-memories.

FIG. 2 and FIG. 3 show implementations of the concept described in FIG. 1 for the purpose of controlling the voltage supplied to two independent processors and to two memory elements respectively. The system 1a of FIG. 2 comprises an electronic processing arrangement 2a, a power supply 3a, and a control apparatus 4a. The electronic processing arrangement comprises two digital signal processors (DSPs) 8i and 8ii provided to perform, during normal operation, identical electronic processing tasks in parallel. The processors may be configured to carry out the tasks differently but the processors are configured to provide identical outputs. The two DSPs are powered by the power supply 3a. Moreover, as shown in FIG. 2, the control apparatus receives the outputs from the two DSPs. The control apparatus comprises an error detection circuit 5a, voltage controller 6a, and an error-recovery circuit 7a.

In a spacecraft communication system, each processor on the spacecraft is typically provided with a redundant processor carrying out the same tasks in order to increase reliability. In the system of FIG. 2, this redundancy is exploited to allow errors to be detected, as will be described in more detail below. However, the control apparatus 4a could be used in any system in which two processors carrying out the same processing tasks are used.

The DSPs 8i and 8ii can receive inputs from other systems. The same instructions may be provided to both DSPs. Alternatively, the instructions provided to the two DSPs pertaining to a task which they should both perform may differ, for instance in their ordering. The DSPs perform processing tasks based on the instructions and output the results to both a memory (not shown in FIG. 2) or other suitable recipient unit and to the control apparatus 4a. The error detection circuit 5a of FIG. 2 detects errors in the outputs of the two DSPs by comparing the two outputs and the outputs of both DSPs are considered to be erroneous if they do not match. After checking the outputs, the error detection circuit 5a communicates to the error-recovery circuit 7a and the voltage controller 6a whether or not the outputs are detected as being erroneous. The voltage controller analyses the information about errors received to decide whether and how to vary the supply voltage to the DSPs 8i and 8ii, as described with respect to FIG. 1. The extent of any voltage adjustment may depend on the processors. If the voltage controller carries out a more comprehensive analysis of the error behaviour, for example a calculation of the error rate, the voltage controller may update its previous analysis based on the new information. The lower the supply voltage, the higher the error rate will be in the outputs. If too many errors are being detected the voltage controller will increase the voltage by an appropriate amount. Conversely, the controller may reduce the voltage if there are no, or very few errors, detected.

The system 1a maintains a record of the state of the DSPs 8i and 8ii before each processing operation in order to facilitate the repetition of the same calculation should it be required. If an error has been detected, the error-recovery circuit 7a responds to the ensuing information communicated by the error detection circuit 5a by causing the DSPs to repeat the calculation. It is contemplated that the DSPs may have a checkpointing capability which maintains the record of their state before each processing operation. This capability may be implemented in software, for example by modifying the operating system of the DSP. Alternatively, the error-recovery circuit may maintain the record of the states of the DSP before each processing operation.

The DSPs 8i and 8ii repeat the calculations until the error detection circuit 5a does not find the DSP outputs to be erroneous. If the erroneous output has been written to memory, the error recovery process will cause the DSP to over-write the erroneous data in memory. In this way the supply voltage is varied in a closed loop fashion to target the lowest power consumption possible without final output errors. It is conceived that the DSPs 8i and 8ii may be forced to reboot by the control apparatus 4a if their outputs are still detected as being erroneous after two repetitions of the same processing task. Further, the DSPs may, for example, be powered off and on again if their outputs are still detected as being erroneous after three repetitions of the same processing task.

A system as shown in FIG. 2 was implemented using two Texas Instruments™ C6713 DSP processors on separate C6713 DSK evaluation boards. The evaluation boards were run in parallel, performing fast Fourier transforms and bit-level data compression algorithms. The checksums of the outputs of the two processors were compared and the supply voltage to the processors was controlled based on whether the checksums agreed with each other or not. At full operating clock-frequency, it was found that the power consumption could be reduced by 33% relative to the nominal processor operating voltage. At half maximum clock speed a 71% reduction of power consumption was found, over and above the standard 50% reduction expected at the reduced clock speed.

It will be appreciated that above description of how the voltage to two processors can be adaptively controlled is just exemplary. Although it has been described that the error detection circuit 5a of FIG. 2 detects errors by comparing the outputs of the two DSP 8i and 8ii, it is contemplated that the error detection circuit may alternatively detect errors in the outputs of the two DSPs by comparing values calculated from the outputs, for example checksum values. If checksums are used to examine outputs, the calculation of the checksum values may be performed by the DSPs themselves and then sent to the error detection circuit for examination, or the calculation of the checksum may be performed by the error detection circuit. Instead of the DSPs writing to memory, or another recipient unit, and the control apparatus in parallel, the DSPs may write to memory, or other recipient unit, indirectly via the control apparatus. The output of the DSPs can then be analysed and corrected in the control apparatus before being provided to the one or more recipient units.

Moreover, as opposed to the error detection circuit 5a communicating, to the voltage controller 6a and error-recovery circuit 7a, whether or not one or both of the outputs are detected as being erroneous, the error detection circuit may communicate information to the voltage controller and/or the error-recovery circuit only when an error is detected. In this case, not receiving a communication from the error detection circuit during a certain period might be interpreted as a signal that no error was detected.

Additionally, in FIG. 2, the DSPs 8i and 8ii share the same power supply 3a. Alternatively, the DSPs may not share the same power supply. The voltage supplied to each DSP may also be controlled differently and/or by different voltage controllers. This would allow for the power consumption of the electronic processing arrangement to be further optimised by enabling independent optimisation of the power supplied to each DSP. It will be appreciated that although DSPs 8i and 8ii are shown in FIG. 2, the control apparatus 4 could also be used to control analogue processors.

With respect to FIG. 3, the system 1b of FIG. 3 also comprises an electronic processing arrangement 2b, a power supply 3b, and a control apparatus 4b. The electronic processing arrangement 2b of FIG. 3 comprises two random-access-memory (RAM) arrangements 9i and 9ii, each having a parity capability allowing for errors in the data read from the memory to be detected and corrected. This capability relies on the storing of error correcting parity code (ECC parity code) along with the systematic data written to the memory arrangements. As will be described in more detail with respect to FIG. 4, each RAM arrangement may comprise two elements that together store systematic data and the code for detecting and correcting errors. Alternatively, each RAM arrangement may be a single element storing both the systematic data and the correction code. Each element may, for instance, be a module or an individual integrated circuit. With reference to the operation of the system 1b shown in FIG. 3, as further detailed below, the data stored on the RAMs which is involved in this operation is the same on both of the RAMs. In FIG. 3, the RAMs are shown to receive the same input. This input could be a memory access request originating from a single processor. However, the RAMs could alternatively be accessed by separate processors provided that those processors carried out corresponding processing tasks and read identical data from and wrote identical data to their respective RAMs. The processors may write to and read from the RAMs in parallel. The final output value read from the RAMs and checked by the control apparatus 4b would be routed back to both of the processors, either directly from the RAMs or via the control apparatus. The control apparatus 4b comprises an error detection circuit 5b, voltage controller 6b, and an error-recovery circuit 7b. The electronic processing arrangement 2b is powered by the power supply 3b. The control apparatus 4b receives the outputs from the two RAMs.

In one example, when one or more processors read the data stored in the RAMs 9i, 9ii, the read data is provided to the one or more processors (not shown in FIG. 3) and the control apparatus 4b in parallel. The error detection circuit 5b of FIG. 3 checks for errors in the output of each of the two RAMs 9i and 9ii by using the error detecting properties of the ECC parity code. The generation and use of parity codes, including ECC parity codes, is known in the art and will not be described in detail herein. Briefly, the error detection circuit may calculate parity data from the systematic data in the output and compare this to the parity code received in the output. If they are not the same, the error detection circuit may determine that there is an error in the output. Erroneous RAM outputs may be the result of errors in the data stored on the RAM or may be due to corruption of the data as it is read from the RAM.

In the system of FIG. 3, after checking the RAM outputs, the error detection circuit communicates information to the error-recovery circuit 7b and the voltage controller 6b concerning the RAM outputs and whether or not one or both of them are detected as being erroneous. As in the systems 1 and 1a described with respect to FIGS. 1 and 2, the voltage controller 6b responds to this communication by analysing the error information to decide whether and how to vary the supply voltage to the RAMs 9i and 9ii. If the voltage controller carries out a more comprehensive analysis of the error behaviour, it may update its previous analysis based on new information. The lower the supply voltage, the higher the error rate will be in the outputs. If too many errors are being detected the voltage controller will increase the voltage by an appropriate amount, and vice versa if too few errors are being detected. As mentioned above, the analysis may just involve increasing the voltage by a fixed amount if an error is detected and lowering the voltage by a fixed amount if no errors have been detected after a predetermined time period. The supply voltage may be maintained at the minimum value capable of sustaining predominantly correct operation while at the same time allowing occasional errors to occur.

If an error has been detected, the error-recovery circuit 7b responds to information communicated by the error detection circuit 5b in either of two ways, depending on the nature of the error. If the error is correctable using the ECC parity code, the error-recovery circuit will cause the correction of the output by this method. Using the corrected value, the control apparatus 4b will then overwrite ('scrub') the stored RAM data pertaining to the erroneous output. If the error exceeds the error correcting capability of the ECC parity code, and the output of only one of the RAMs was found to be erroneous, the error-recovery circuit causes the control apparatus to use the correct data, from the RAM whose output was not erroneous, to scrub the stored RAM data pertaining to the erroneous RAM output. The control apparatus then informs the processor that the previous value read from the memory was wrong and the processor takes the appropriate action of re-reading the corrected value from the memory. In one example, software running on the processor may be configured to read the memory again in response to information from the control apparatus indicating that the previous value was wrong. If the processor has already started using the incorrect data, it discards it and starts again. In some implementations, the control apparatus informs the processor as soon as it has detected an error such that it can stop any processing tasks based on the incorrect data. In other implementations, it only informs the processor once it has ensured that the data in the memory is correct. In this way, the control apparatus 4b allows very low-power operation of the RAMs 9i and 9ii by operating them at, or very close to, the limit of failure without incurring any loss in the accuracy of the final output.

It is contemplated that in a system where a processor is provided with a redundant parallel processor, such as is often found onboard spacecraft, and each of those processors have cache parity RAM, the system of FIG. 3 could be employed to reduce the voltage supplied to each cache parity RAM.

The process for adaptively varying the voltage of memory elements described with respect to FIG. 3 is just one example and modifications are contemplated.

It should be realised that although the memory elements have been described above to be parity RAM memory elements, the system 1b of FIG. 3 is not limited to any specific type of RAM and could, for example, include DRAM, SDRAM or SRAM. The ECC parity code used on the parity RAM may, for example, be Hamming code or a multidimensional parity-check code (MDPC). Alternatively, as opposed to comprising two memory arrangements, each implementing ECC parity code, the electronic processing arrangement 2b could comprise two ECC memory units.

Moreover, instead of the memory elements providing their outputs to the processors and the control apparatus in parallel, any output may be checked and corrected in the control apparatus before it is provided to the processor.

Additionally, in FIG. 3, the RAMs 9i and 9ii share the same power supply 3b. Alternatively, the parity RAMs 9i and 9ii may not share the same power supply. The voltage supplied to each parity RAM may also be controlled differently and/or by different voltage controllers. This could allow for the power consumption of the electronic processing arrangement 2b to be further optimised by enabling the independent optimisation the power supplied to each RAM.

As opposed to the error detection circuit 5b communicating to the voltage controller 6b and error-recovery circuit 7b whether or not one, or both, of the outputs are detected as being erroneous, the error detection circuit may communicate information to the voltage controller and/or the error-recovery circuit only when an error is detected. In this case, not receiving a communication from the error detection circuit during a certain period might be interpreted by the relevant receiving unit as a signal that no error was detected.

It will be appreciated that although FIG. 3 has been described to comprise two RAMs 9i and 9ii, the system would also be able to control the voltage supplied to a single RAM and correct the errors of the single RAM. The correct output could be recovered as long as the errors are correctable by the error correction code or by alternative means and the correct data does not have to be obtained from another RAM.

Figure 4:
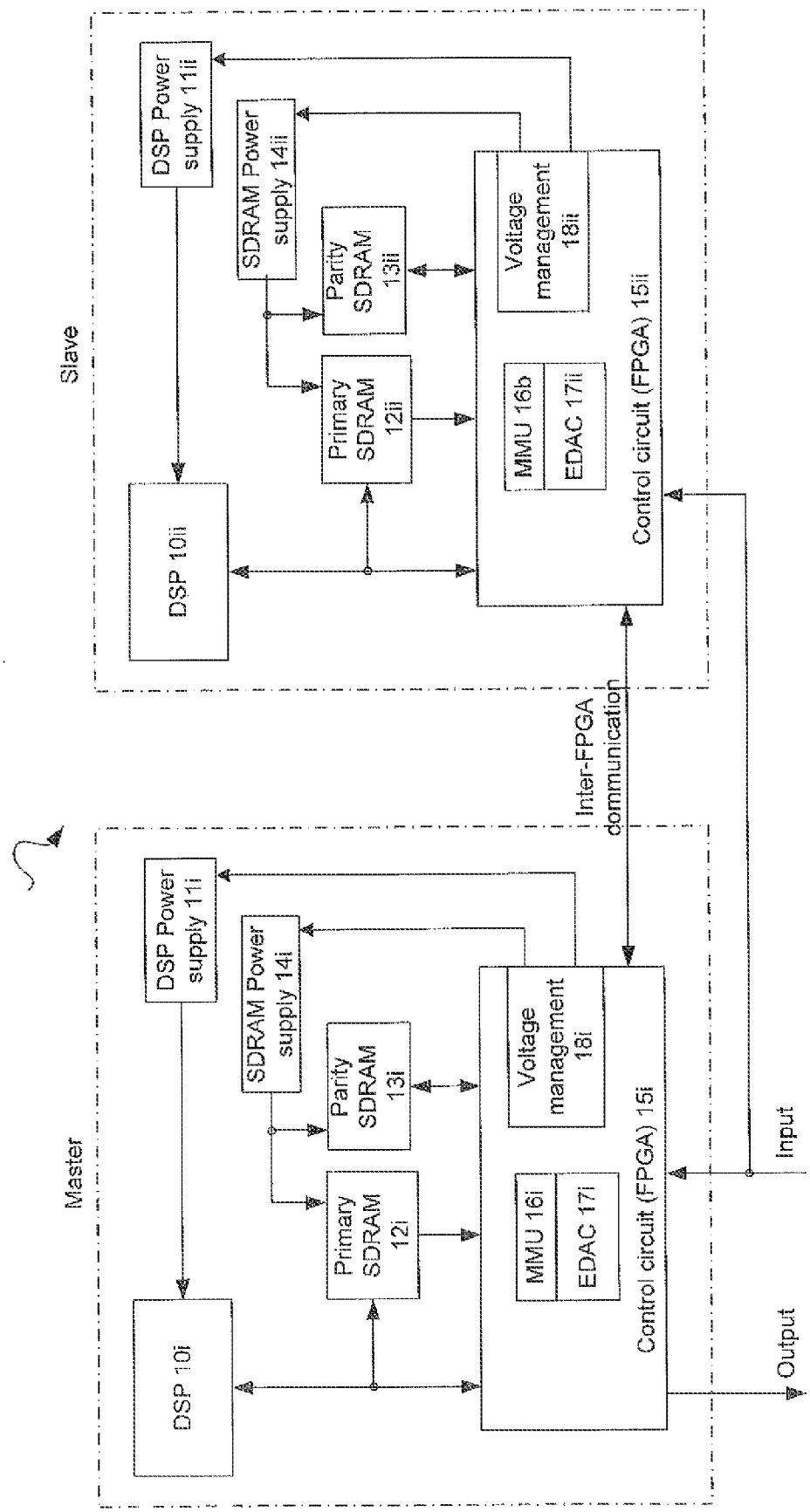
FIG. 4 shows the components of a system implementing the concept of the system of FIG. 1 to control the voltage supplied to an electronic processing arrangement comprising two digital signal processors with respective memory elements.

With reference to FIG. 4, a specific implementation of a system for controlling the voltage to both processors and memories is shown. The system 1c comprises first 10i and second 10ii DSPs, first 11i and second 11ii DSP power supplies, first 12i and second 12ii primary synchronous dynamic random-access-memory (SDRAM) units for the first and second DSPs respectively, first 13i and second 13ii parity SDRAM for the first and second DSPs respectively and first 14i and second 14ii SDRAM power supplies. The system also comprises first 15i and second 15ii control circuits, together forming a control apparatus or control arrangement. Each circuit may also be considered a control apparatus or arrangement. It will be appreciated that the first and second DSPs 10i, 10ii, the first and second primary SDRAMs 13i, 13ii and the first and second parity SDRAMs 14i, 14ii together correspond to the electronic processing arrangement 2 of the system 1 of FIG. 1. Moreover, the control arrangements 15i, 15ii together, or on their own, can be considered to correspond to the control apparatus 4 of system 1 of FIG. 1. The first and second DSPs, 10i and 10ii, are powered by the first and second DSP power supplies, 11i and 11ii, respectively. The first primary and parity SDRAM units 12i, 13i and the second primary and parity SDRAM units 12ii, 13ii are powered by the first and second SDRAM power supplies 14i, 14ii, respectively. The first and second control circuits 15i and 15ii are connected to the first and second DSPs 10i and 10ii, DSP power supplies 11i and 11ii, primary SDRAMs, parity SDRAMs and SDRAM power supplies respectively. The first and second primary SDRAMs 12i, 12ii are also connected to the first and second DSPs 10i, 10ii respectively. The first and second parity SDRAMs 13i, 13ii are connected to the first and second DSPs 10i, 10ii via the control circuits 15i, 15ii. However, they can also be connected directly to the first and second DSPs 10i, 10ii.

The first and second parity SDRAMs, 13i and 13ii, contain ECC parity code relating to the data stored on the first and second primary SDRAMs 12i and 12ii respectively and containing some information for the reconstruction of the primary SDRAM information. The ECC parity code used is a single-error-correcting and double-error-detecting code, for example Hamming code. The parity-bits are calculated from the systematic information written to the primary SDRAM 12i and 12ii such that, when the systematic and parity information is read together, the parity information is sufficient to reconstruct the systematic information in the case that a single bit in the systematic information is incorrect. Taken alone, the data in the parity information is not sufficient to define the relevant systematic information. If a single bit in only the parity information is incorrect, this can also be corrected using the systematic information. If any two bits across the primary and/or parity information are incorrect, the output can be identified as incorrect, but can not be directly corrected as the erroneous bits can not be identified. The error will then need to be corrected using the output of the primary or parity RAM for the other processor of the system. In the absence of any bit errors, or once a single bit error has been corrected, the primary information is then used for any required processing or output.

The first and second control circuits 15i and 15ii are field-programmable gate arrays (FPGA) programmed to detect and correct errors and control the voltage. They provide corresponding functionality to the functionality of the error detection unit, error recovery unit and the voltage controller unit described with respect to FIG. 1 or the error detection circuit, error recovery circuit and voltage controller described with respect to FIGS. 2 and 3. The FPGAs also include a memory management capability (MMU) 16i and 16ii. The FPGA is programmed to compare outputs from the first and second DSPs and detect and correct errors based on error management data, such as error detection and correction codes. The FPGA may also be configured to calculate checksums for the outputs from the DSPs. The FPGAs may also be programmed to generate error detection and correction codes for storing in the parity SDRAM. The FPGA may include separate circuitry 17i and 17ii for providing support for the use of error detection and correction codes (EDAC). It may also include separate circuitry 18i and 18ii for providing a voltage management capability. The voltage management capability is used to vary the voltage supplied by the DSP and SDRAM power supplies independently. The DSPs can receive inputs from other systems via their respective FPGAs. The FPGAs may receive inputs from external systems and, furthermore, these inputs may control or reconfigure the FPGAs.

The first DSP 10i, first DSP power supply 11i, first primary SDRAM 12i, first parity SDRAM 13i, first SDRAM power supply 14i and first control system 15i comprise a system which is designated the master system. The second DSP 10ii, second DSP power supply 11ii, second primary SDRAM 12ii, second parity SDRAM 13ii, second SDRAM power supply 14ii and second control system 15ii comprise a system designated the slave system. The master and slave systems are connected via their respective FPGAs. The slave may provide a redundant processor and memory in case the first processor and memory malfunctions, as is required in some processing systems. The system of FIG. 3 incorporates independent, closed loop, error dependant, control of the power supplied to each DSP and each pair of primary SDRAM and parity SDRAM.

The first and second DSPs 10i and 10ii perform substantially the same processing tasks in parallel and output to their respective primary SDRAMs 12i and 12ii. Each DSP contains a checkpointing capability which maintains a record of the state of the DSP before each processing operation in order to facilitate the repetition of the same calculation, should it be required.

The first and second FPGAs 15i and 15ii receive the outputs of the DSPs 10i and 10ii to the first and second primary SDRAMs 12i and 12ii respectively and each FPGA performs a checksum calculation on the received outputs. The slave FPGA 15ii then outputs its checksum value to the master FPGA 15i, which then compares their values and outputs the result back to the slave FPGA. The outputs of both DSPs are considered to be erroneous if their checksum values do not match.

Each FPGA then updates its own analysis of the error behaviour of the outputs of its DSPs using the voltage management 18i, 18ii circuitry. Depending on these analyses, each FPGA then decides whether, and how, to vary the supply voltage to its DSP. The lower the supply voltage to a DSP, the higher its output error rate will be. If too many errors are being detected in the outputs of a DSP, its FPGA will instruct the power supply for that DSP to increase the voltage supplied to the DSP, and vice versa if too few errors are being detected. The voltage may be increased or decreased by a fixed amount or by an amount determined by an analysis of the error behaviour. If an error has been detected, the FPGAs 15i and 15ii also respond by triggering their respective DSPs to repeat the calculation. The FPGAs may also trigger their respective DSPs to overwrite the erroneous data passed to the SDRAMs with the new values. This process is repeated until the checksum values of the outputs from the two DSPs 10i and 10ii are found to be the same. At this point, after implementing a parity algorithm, each FPGA writes the appropriate parity information, pertaining to the information written to its primary SDRAM, to its parity SDRAM.

In this way the supply voltage to the DSPs 10i and 10ii is varied in a closed loop fashion to target the lowest power consumption possible without leaving erroneous data written on the primary SDRAMs 12i and 12ii and parity SDRAMs 13i and 13ii.

During normal operation, when data is required by the DSPs from the RAM it is sourced by both FPGAs 15i and 15ii from their respective primary SDRAM 12i and 12ii, and the relevant information on their parity SDRAM 13i and 13ii pertaining to the required primary SDRAM data is also sourced. Both FPGAs then use the EDAC code on the information retrieved to check it for errors. Each FPGA 15i and 15ii then updates its own analysis of the error behaviour of its primary and parity SDRAM outputs. Depending on these analyses, each FPGA then decides whether, and how, to vary the supply voltage to its primary SDRAM 12i and 12ii and parity SDRAM 13i and 13ii. The lower the supply voltage to a RAM, the higher its output error rate will be. If too many errors are being detected in the output of a primary and parity SDRAM pair, its FPGA will increase the voltage supplied to that primary and parity SDRAM pair. Conversely, if errors only very infrequently occur, the FPGA will decrease the voltage supplied to the primary and parity SDRAM pair.

The FPGAs 15i and 15ii may independently decrease and increase the supply voltage to their respective primary and parity SDRAM pairs until the voltage converges at a level at which an acceptable number of RAM output errors occur. For example, the voltages to the primary and parity SDRAMs and DSPs may be controlled such that the overall error rate of the system 1c remains at an acceptable level.

Erroneous RAM outputs may be the result of errors in the data stored on the RAM or may be due to corruption of the data as it is read from the RAM. As mentioned with respect to FIG. 3, if an error has been detected in information read from a primary and parity SDRAM pair, its respective FPGA will respond in one of two ways depending on the nature of the error. If the error is single-bit correctable using the error correction parity code (ECC parity code), the FPGA will perform this correction. The FPGA will then scrub the stored primary and parity SDRAM data, pertaining to the erroneous output, with the corrected value, written back via the DSP. If the error exceeds the error correcting capability of the ECC parity code, and the output of only one of the primary and parity SDRAM pairs was found to be erroneous, the FPGA with the erroneous data instructs its DSP to retrieve the correct data from the other SDRAM of the other DSP and use this correct data to scrub the stored primary and parity SDRAM data, pertaining to the erroneous output, with the correct value. The DSP may stop what it is doing and communicate with the other DSP, at the software level, in order to obtain the correct data from the SDRAM of the other DSP and then write this data directly to the SDRAM pair which produced the erroneous output. In this way, very low-power operation of the SDRAM pairs can be achieved by forcing them to operate at, or very close to, the limit of failure without incurring any loss in the accuracy of their final output or leaving erroneous data stored on them.

In the above description of the system 1c of FIG. 4, the FPGAs 15i and 15ii are described as performing checksum calculations on the outputs they receive from their respective DSPs 10i and 10ii. Alternatively, it is conceived that the DSPs themselves may perform the calculation of the checksum values before then outputting these to their respective FPGAs. The comparison of the checksum values for each DSP output is described above as being performed by the master FPGA 15i. Alternatively, the checksum values of the master FPGA may be routed to the slave FPGA 15ii for comparison with the checksum values of the slave FPGA. It is also conceived that the checksum values may be exchanged between the two FPGAs so that the comparison may be performed by both FPGAs. This could provide a redundancy or allow for error checking of the comparisons.

Each DSP 10i and 10ii is described above as having a checkpointing capability which maintains a record of the state of the DSP before each processing operation. This capability may be implemented in software, for example by modifying the operating systems of the DSPs. Alternatively, each FPGA 15i and 15ii may maintain the record of the state of its DSP before each processing operation in order to facilitate the repetition of the same calculation, should it be required.

In the above description of the system 1c of FIG. 4, the parity SDRAM 13i and 13ii is written to by its respective FPGA and only when the outputs from the two DSPs 10i and 10ii have been found to be correct. Alternatively, the DSPs may be capable of implementing parity-generation onboard, without input from their FPGAs. In this case the DSPs 10i, 10ii might write data to their respective parity SDRAMs 13i, 13ii as well as their respective primary SDRAMs 12i and 12ii and FPGAs 15i and 15ii. Any erroneous data in the parity SDRAM, as well as the primary SDRAMs, will then be overwritten when the DSPs are instructed to repeat a processing task that provided an erroneous output value.

Above it has been described that if an error in a primary and parity SDRAM pair reading exceeds the error correcting capability of the ECC parity code, and the output of only one of the primary and parity SDRAM pairs was found to be erroneous, the FPGA with the erroneous data signals to its DSP to retrieve the correct data from the SDRAM of the other DSP via the other DSP. However, in other embodiments, the FPGA belonging to the SDRAM which has produced an erroneous output may, alternatively, retrieve the correct data from the SDRAM associated with the other FPGA via the other FPGA.

As mentioned above, on a spacecraft communication system, such as a satellite communication system, each processor on the spacecraft is typically provided with a redundant processor carrying out the same tasks in order to increase reliability by providing a backup. Often a spacecraft processor will operate in conjunction with a respective RAM or parity RAM. The system 1c of FIG. 4 may be employed to control the voltages supplied to such a spacecraft electronic processing arrangement, by exploiting the component redundancies to allow for errors to be detected.

Figure 5:
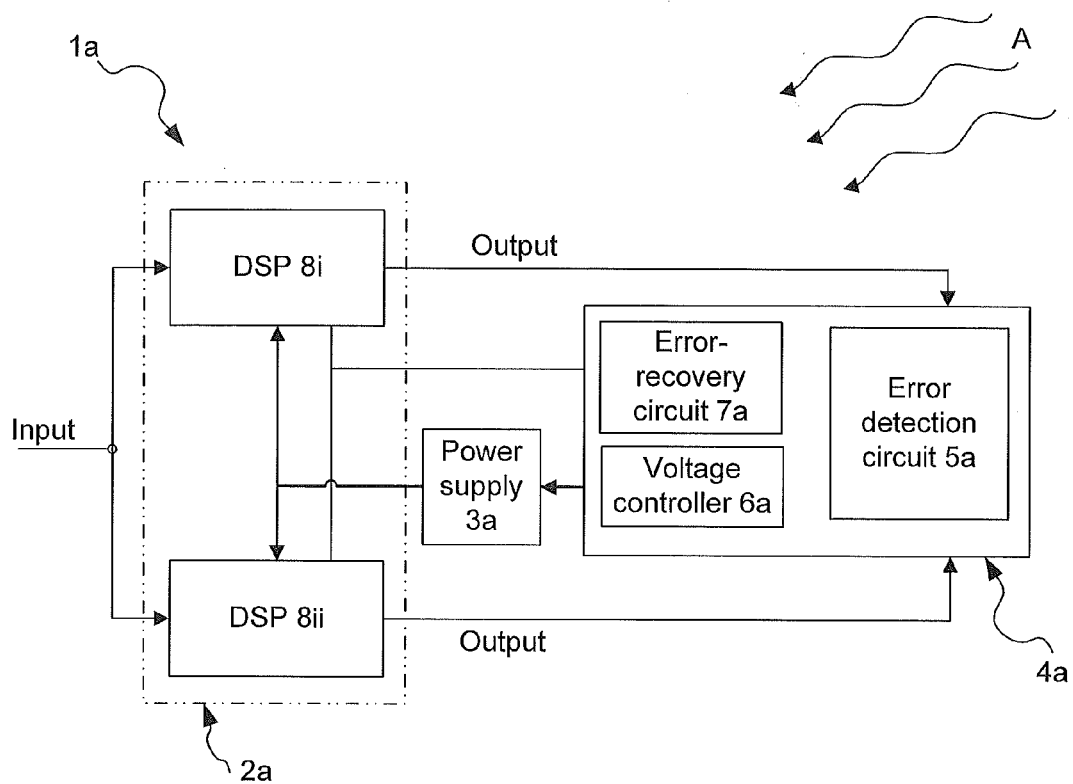
FIG. 5 is a schematic block diagram of the embodiment of FIG. 2 implemented in an ionising radiation environment.

With reference to FIG. 5, the system 1a of FIG. 2 is shown implemented in an ionising radiation environment A. Like components of the system 1a of FIG. 5 share the same labelling and reference numerals as like components within the system 1a of FIG. 2. Disregarding the presence and effects of the ionising radiation A, the system of FIG. 5 operates in the same way as the system of FIG. 2, as described above. Accordingly, the system of FIG. 5 varies the supply voltage required by its electronic processing apparatus 2a in a closed loop fashion to target the lowest power consumption possible without incurring final output errors.

Electronic processors, for example the processors in modern CPUs, can experience single event latch-up when exposed to ionising radiation. Such an event can be very damaging to a processor and can potentially prevent it from functioning. The processing arrangement 2a of FIG. 5 comprises two DSPs 8i and 8ii which, when powered with a voltage within their range of normal operating voltages, are susceptible to single event latch-up when exposed to ionizing radiation. For example, the DSPs may be any commercial off-the-shelf processors. As a specific example, the processors may be Texas Instruments™ C6727 digital signal processors or other similar processor, which would typically experience single event latch-up if not specifically modified to be suitable for space applications. By reducing the voltage supplied to the DSPs 8i and 8ii, the DSPs may have a reduced risk of experiencing single event latch-up.

A typical silicon structure of a processor integrated circuit might contain adjacent n-p-n and p-n-p transistors in very close proximity. An ionizing radiation particle can create a conducting path between two such transistors. In some such scenarios, when certain feedback conditions exist, this conducting path can be self-sustaining and may cause a short-circuit. This can be damaging to the processor in question and therefore poses a significant problem in space applications where exposure to ionising radiation can be considerably greater than that experienced, for example, on Earth.

If the voltage supplied to the processor is lower than a certain amount, termed the 'holding voltage', then the feedback conditions referred to above will not exist, and, following a radiation strike, the latch-up condition will not be maintained by the supply voltage. Therefore, reducing the supply voltage of a processor while keeping all of the other parameters of the processor device the same will reduce the vulnerability of the processor to single event latch-up. It is contemplated that the control apparatus 4a can be used to maintain, and adaptively control, the voltage provided to the DSPs 8i and 8ii below a determined holding voltage, while also correcting any DSP output errors. Changes in environmental factors, such as radiation type and device temperature, may alter the actual holding voltage. It is conceived that the control apparatus may react to such environmental changes by revising its determined holding voltage accordingly. It is contemplated that the control apparatus 4a automatically maintains the voltage below the holding voltage by controlling the voltage based on 'normal' errors, not due to single event latch-up, as described with respect to FIG. 2. It is contemplated that if the control apparatus is operated to control the voltage to the processors such that only a small number of errors, corresponding to for example a predetermined low error rate, occur, as described with respect to FIG. 2, the voltage may also be sufficiently low to eliminate single event latch-up.

It will be appreciated that although FIG. 5 shows two processors, the control apparatus could also be used to render an electronic processing arrangement comprising a single processor less vulnerable to single-event latch up. Moreover, instead of, or in addition to, controlling a processor, a control apparatus could be used to control the voltage supplied to a memory element, such as a RAM, to render it less vulnerable to single event latch-up. For example, the control apparatus described with respect to FIG. 3, for controlling the voltage to an electronic processing arrangement comprising memory elements, may reduce the voltage to the electronic processing arrangement and thereby avoid, or reduce the risk of, single event latch-up occurring in the memory elements. It will be appreciated that a control apparatus implemented without the error recovery functionality will still be suitable for operating one or more processors and/or one or more memory elements at a voltage level at which single event latch-up does not occur.

Figure 6:
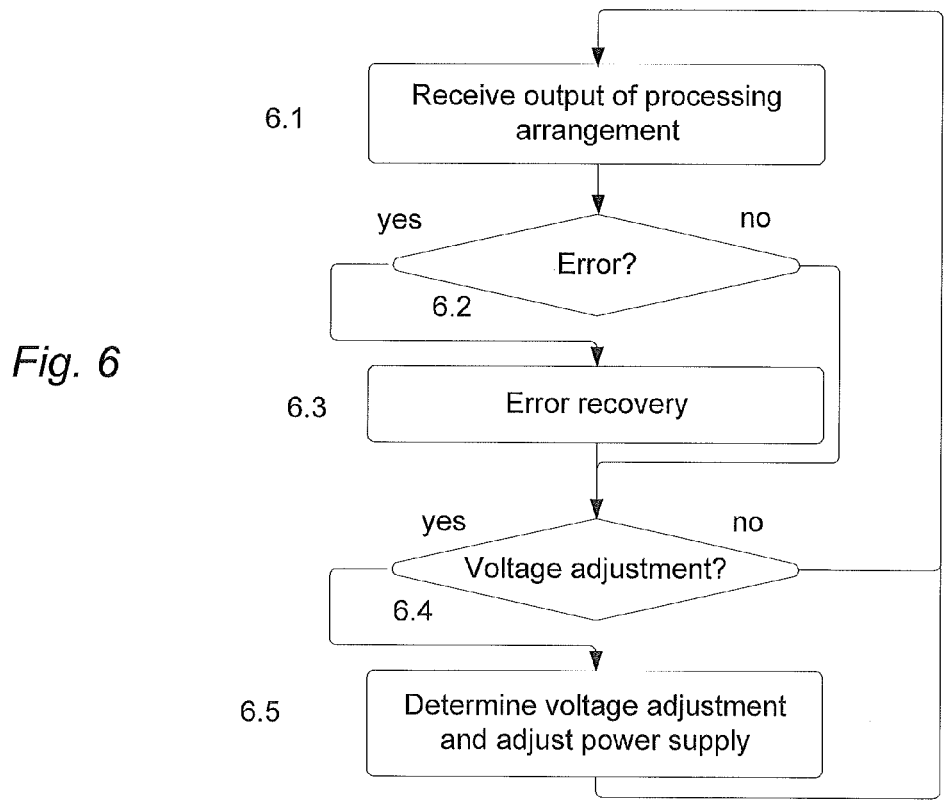
FIG. 6 illustrates a process for adaptively adjusting the voltage to the electronic processing arrangement.

With reference to FIG. 6, a flow diagram is shown which illustrates one method of reducing a voltage supplied to an electronic processing arrangement as implemented by systems 1, 1a, 1b and 1c. For the sake of clarity, only the reference numerals of the system 1 of FIG. 1 will be used in the description of FIG. 6 but it will be appreciated that the method also applies to the systems of FIGS. 2, 3, 4 and 5. Outputs of a processing arrangement 2 are first received at step 6.1 by the control apparatus 4 which then determines whether the output contains errors at step 6.2. As mentioned with respect to FIGS. 1 to 5, the output may be the output of a processor or the output from a memory element. If the output is the output of a processor, the error may be detected by comparing the output to the output of a different processor. Alternatively, a single processor may carry out the same processing task twice and the results may be compared. If the output is the output of a memory element, the error may be detected by checking error management data in the output of the memory element. It will be appreciated that step 6.3 can include any of the error detection methods described with respect to FIGS. 1 to 4 above. If errors are detected in the output of the processing arrangement 2, then error recovery is implemented at step 6.3 by the control apparatus 4. The error recover may involve any of the error recovery methods described with respect to FIGS. 1 to 5, including instructing a processor to repeat a processing task if the error was in an output of a processor and correcting the data stored in memory if the error was in the data read from a memory. If the output has been provided to a processor, the error recovery may also involve instructing the processor to discard the received value and restart any processing task that used the erroneous value using the correct value. If the erroneous output of a processor has been stored in memory, the error recovery may also involve instructing a processor to overwrite the erroneous data in memory.

The control apparatus 4 then determines whether the voltage to the electronic processing arrangement 2 needs adjusting at step 6.4. If there are no errors in the output of the processing arrangement, the method proceeds directly to step 6.4 and determines whether a voltage adjustment is needed. A decision about whether to adjust the voltage or not is taken based on an analysis of the error behaviour of the electronic processing arrangement outputs. If an error has occurred, a record of the error may be made and the control apparatus may then proceed to directly increase the voltage. If no error has occurred, the analysis may involve determining how long it has been since the last error and reducing the voltage if the time period since the last error exceeds a predetermined time period. Alternatively, the decision of step 6.4 may be based on a calculation of an average error rate or other suitable value on the basis of which a decision can be taken about whether to adjust the voltage. It should be realised that the control apparatus may not decide to determine whether a voltage adjustment is needed each time an error occurs or each time the output is found to be correct. For example, a decision about whether to adjust the voltage can instead be taken at predetermined times, for example at regular intervals.

If the control apparatus determines that the supply voltage should be altered, it adjusts the voltage, which may involve instructing the power supply to adjust the voltage, at step 6.5. The control apparatus 4 may use the analysis of the error behaviour of the electronic processing arrangement outputs to determine how to adjust the voltage before performing the adjustment. In some embodiments, the magnitude of each adjustment is constant but the analysis of the error behaviour determines whether the adjustment is to increase the voltage or decrease the voltage. The magnitude of the adjustment may also be variable and determined based on the analysis of the error behaviour. For example, if the error rate is high, the control apparatus may increase the voltage by a greater amount than if the error rate is lower. Following this, or if the control apparatus had determined that the supply voltage did not require adjustment, the whole process is then repeated as the control apparatus again receives the next output of the processing arrangement 6.1. It is contemplated that in some implementations, a series of output values can be checked in parallel and error recovery of more than one erroneous error output values can also be carried out in parallel by the control apparatus.

A set of instructions corresponding to the method described with respect to FIG. 6 can be stored, as part of a computer program, and a controller can be configured to execute the instructions such that the method is then carried out.

It will be appreciated that the method described with respect to FIG. 6 is only exemplary and variations are contemplated. For example, it will be appreciated that when there is an error, a decision on whether to adjust the voltage may be taken (step 6.4) and any voltage adjustments required (step 6.5) may be carried out before the error is corrected (step 6.3). Moreover, it is contemplated that the process may not include the step of carrying out error recovery 6.3. The system may be set up to handle a small number of errors and/or the errors may be corrected elsewhere, in which case the control apparatus does not need to include the error recovery functionality.

Whilst specific examples of the invention have been described, the scope of the invention is defined by the appended claims and not limited to the examples. The invention could therefore be implemented in other ways, as would be appreciated by those skilled in the art.

For example, it should be realised that while a separate voltage controller or management unit, forming part of the control apparatus or FPGA, has been described, the power supply may be configured to provide the function of the voltage controller or management unit and adjust the voltage itself. Moreover, although the analysis of the errors has been described in some embodiments as being carried out in the voltage controller or controller unit, the analysis of the errors may be carried out in the error detection circuit or unit or in a separate circuit or unit altogether.

Additionally, although the memory units to which the voltage is controlled have been described in the embodiments to be RAM, they can be any type of memories. It is contemplated that the SDRAM described in the system of FIG. 4 could, alternatively, be cache RAM. Moreover, the processors could be any type of processors for which it is desired to reduce the supply voltage.

The invention claimed is:

1. An apparatus for controlling a supply voltage to an electronic processing arrangement having a processor and/or a memory element, the apparatus being configured to receive an output of the electronic processing arrangement and comprising:
    error detection means for detecting errors in an output of the electronic processing arrangement; and
    means for adaptively varying a supply voltage to the electronic processing arrangement based on an analysis of errors detected in the output of the electronic processing arrangement in order to supply a minimum voltage that results in a threshold minimum number of errors.

2. An apparatus according to claim 1, comprising:
    means for correcting errors detected in the output of the electronic processing arrangement.

3. An apparatus according to claim 2, in combination with an electronic processing arrangement which comprises:
    two independent processors for carrying out corresponding processing tasks to provide identical output values, wherein the error detection means is configured to detect errors in an output of the electronic processing arrangement by comparing an output of one of the two processors with an output of the other of the two processors.

4. An apparatus according to claim 3, wherein the means for correcting errors is configured to instruct at least one of the two independent processors to repeat a processing task to correct an error in an output of the electronic processing arrangement.

5. An apparatus according to claim 2, in combination with an electronic processing arrangement which comprises:
    one or more memory elements configured to store system data and error management data associated with the system data, an output of the electronic processing arrangement providing the system data and error management data, and wherein the error detection means is configured to detect errors in the system data by analyzing error management data associated with said system data.

6. An apparatus according to claim 5, wherein the means for correcting errors in the output of the electronic processing arrangement is configured to correct the output based on the error management data.

7. An apparatus according to claim 5, wherein the one or more memory elements comprise:
    two memory elements configured to store a same data, and wherein the means for correcting errors is configured to correct an error detected in an output from one memory element by retrieving a correct value from the other memory element.

8. An apparatus according to claim 1 in combination with an electronic processing arrangement which comprise:
    at least one out of a processor and a memory element and the means for adaptively varying the voltage is configured to control the voltage to an appropriate level where a likelihood of a single event latch-up occurring in the at least one out of a processor and a memory element is reduced.

9. A system comprising:
    an electronic processing arrangement; and
    an apparatus according to claim 1 for controlling the voltage supplied to the electronic processing arrangement.

10. A method of reducing a supply voltage provided to an electronic processing arrangement having a processor and/or a memory element, the method comprising:
    receiving an output of the electronic processing arrangement;

determining if the output of the electronic processing arrangement includes an error;

determining if an adjustment to the voltage supplied to the electronic processing arrangement is desired based on an analysis of errors in the output; and if an adjustment is desired, adjusting the voltage in order to supply a minimum voltage that results in a threshold minimum number of errors.

11. A method according to claim 10, comprising:
if the output of the electronic processing arrangement includes an error, correcting the error.

12. A method according to claim 11, wherein the electronic processing arrangement includes two processors for carrying out corresponding processing tasks to provide identical output values, wherein determining if the output of the electronic processing arrangement includes an error comprises:
comparing an output of one of the processors with an output of the other processor; and wherein correcting the error comprises:
instructing at least one out of the two processors to repeat the processing task.

13. A method according to claim 11, wherein the electronic processing arrangement includes two random access memory elements for storing corresponding data, each memory element being configured to store system data and associated error management data and an output of the electronic processing arrangement including system data and associated error management data, wherein determining if the output of the electronic processing arrangement includes an error comprises:
analyzing error management data in an output of the memory elements, and wherein correcting the error comprises:
correcting an error in the output of one of the memory elements based on the error management data from that memory element or based on data read out from the other memory element.

14. A method according to claim 10, wherein the electronic processing arrangement includes at least one of the processor and the memory element, and wherein controlling the voltage comprises:
controlling the voltage to avoid single event latch-up occurring in the least one of the processor and the memory element of the electronic processing arrangement.

15. A computer program comprising instructions stored on a non-transitory medium such that when executed by a controller will cause the controller to carry out the method of claim 10.

* * * * *